United States Patent
Lin et al.

(10) Patent No.: US 9,431,531 B2
(45) Date of Patent: Aug. 30, 2016

(54) SEMICONDUCTOR DEVICE HAVING DRAIN SIDE CONTACT THROUGH BURIED OXIDE

(71) Applicant: TAIWAN SEMICONDUCTOR MANUFACTURING COMPANY, LTD., Hsinchu (TW)

(72) Inventors: Tung-Yang Lin, New Taipei (TW); Hsin-Chih Chiang, Hsinchu (TW); Ruey-Hsin Liu, Hsinchu (TW); Ming-Ta Lei, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 133 days.

(21) Appl. No.: 14/089,803

(22) Filed: Nov. 26, 2013

(65) Prior Publication Data

US 2015/0145039 A1 May 28, 2015

(51) Int. Cl.
*H01L 29/78* (2006.01)
*H01L 21/74* (2006.01)
*H01L 29/786* (2006.01)
*H01L 29/10* (2006.01)

(52) U.S. Cl.
CPC ......... *H01L 29/7824* (2013.01); *H01L 21/743* (2013.01); *H01L 29/1087* (2013.01); *H01L 29/78624* (2013.01)

(58) Field of Classification Search
CPC .................. H01L 29/66681; H01L 29/78624; H01L 21/7624
See application file for complete search history.

(56) References Cited

U.S. PATENT DOCUMENTS

| | | | | |
|---|---|---|---|---|
| 5,872,044 A | * | 2/1999 | Hemmenway | H01L 21/7624 257/E21.561 |
| 6,013,936 A | * | 1/2000 | Colt, Jr. | H01L 21/7624 257/345 |
| 6,025,237 A | * | 2/2000 | Choi | H01L 21/7624 257/335 |
| 6,127,703 A | * | 10/2000 | Letavic | H01L 29/78624 257/344 |
| 6,521,947 B1 | | 2/2003 | Ajmera et al. | |
| 2011/0127602 A1 | | 6/2011 | Mallikarjunaswamy | |

FOREIGN PATENT DOCUMENTS

KR    2000-0053556    8/2000

OTHER PUBLICATIONS

Notice of Allowance dated Jun. 3, 2016 and English translation from corresponding No. KR 10-2014-0165526.

* cited by examiner

*Primary Examiner* — Jerome Jackson, Jr.
*Assistant Examiner* — Fang-Xing Jiang
(74) *Attorney, Agent, or Firm* — Hauptman Ham, LLP

(57) ABSTRACT

A semiconductor device configured to provide high heat dissipation and improve breakdown voltage comprises a substrate, a buried oxide layer over the substrate, a buried n+ region in the substrate below the buried oxide layer, and an epitaxial layer over the buried oxide layer. The epitaxial layer comprises a p-well, an n-well, and a drift region between the p-well and the n-well. The semiconductor device also comprises a source contact, a first electrode electrically connecting the source contact to the p-well, and a gate over a portion of the p-well and a portion of the drift region. The semiconductor device further comprises a drain contact, and a second electrode extending from the drain contact through the n-well and through the buried oxide layer to the buried n+ region. The second electrode electrically connects the drain contact to the n-well and to the buried n+ region.

20 Claims, 3 Drawing Sheets

SEMICONDUCTOR DEVICE HAVING DRAIN SIDE CONTACT THROUGH BURIED OXIDE

BACKGROUND

Device manufacturers are continually challenged to deliver value and convenience to consumers by, for example, providing integrated circuits that provide quality performance. Some metal-oxide-semiconductor field-effect transistors (MOSFET) designed for high voltage applications (with high breakdown voltage) have structures that make it possible for the transistor to sustain both high breakdown voltages and high currents.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The drawings, incorporated by reference herein in their entirety, comprise the following.

DETAILED DESCRIPTION

Figure 1:
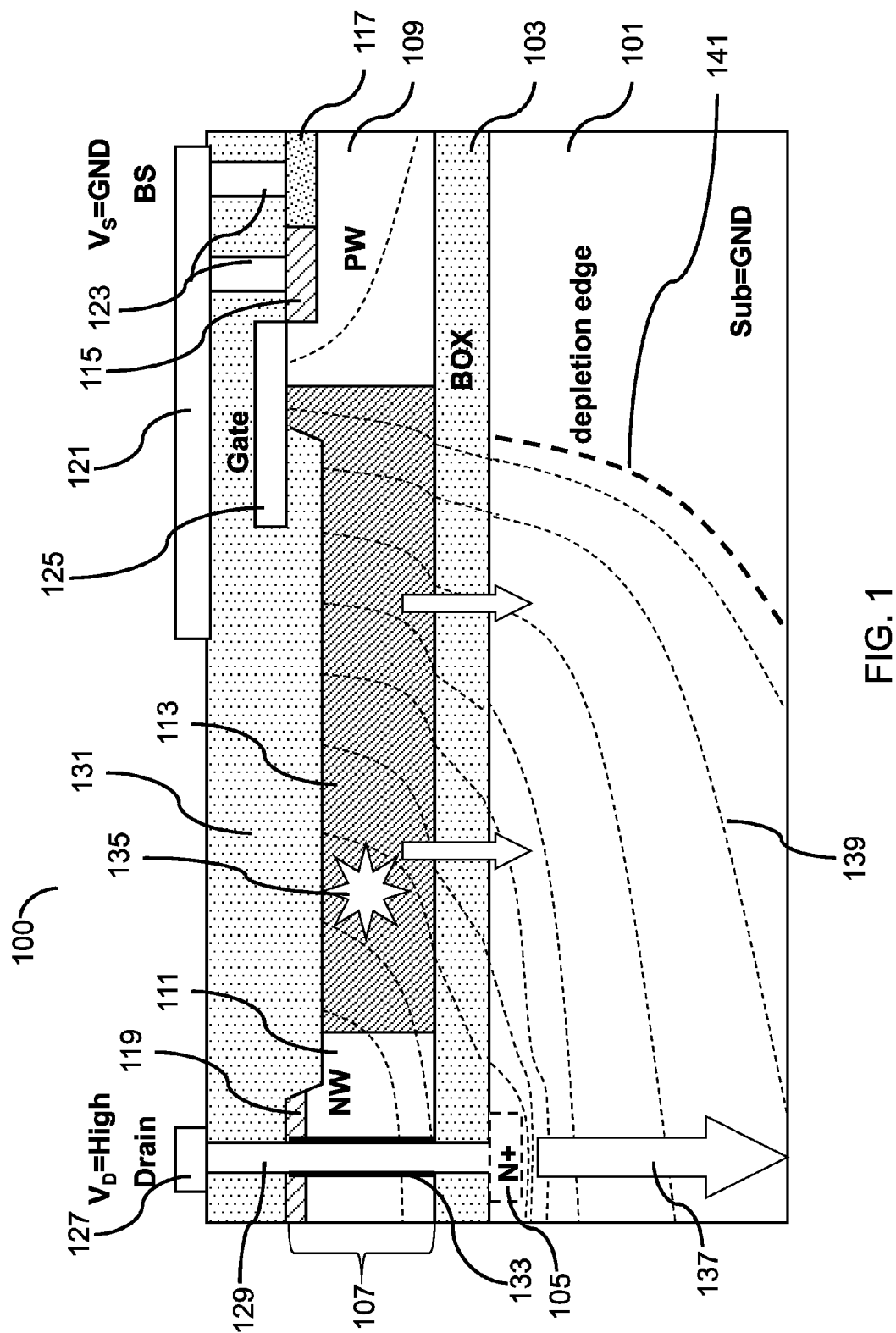
FIG. 1 is a diagram of a semiconductor device, in accordance with one or more embodiments.

The following disclosure provides many different embodiments, or examples, for implementing different features of the invention. Specific examples of components and arrangements are described below to simplify the present disclosure. These are examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Common MOSFET devices such as, but not limited to, silicon-on-insulator (SOI) power devices, lateral diffusion metal-oxide-semiconductor devices (LDMOS), lateral insulated gate bipolar transistors (LIGBT) increase in temperature to a degree that effective performance diminishes and the device overheats thereby either damaging the device or causing the device to shut down. Common MOSFET devices have a breakdown voltage that, if reached, results in a short circuit in the MOSFET device because one or more layers in the MOSFET device no longer function as an insulator.

For example, common SOI power MOSFETs experience potential and heat crowding inside an upper layer of the MOSFET, such as a buried oxide layer. During an off-state operation, breakdown voltage is limited by potential crowding beneath the drain side of the MOSFET device.

To improve heat dissipation, some SOI power MOSFET devices include a contact through buried oxide (CTBOX) on a source side of the MOSFET to ground the source to the substrate. Although a CTBOX formed on the source side of the MOSFET helps with heat dissipation, such a structure fails to improve breakdown voltage because potential crowding still exists beneath the drain of the MOSFET device. Other MOSFET devices include a partial silicon-on-insulator (PSOI) on the drain side of the MOSFET to improve heat dissipation and breakdown voltage. A drain side PSOI improves heat dissipation by opening a heat conduction path to the substrate. A drain side PSOI also improves breakdown voltage by making use of the substrate as a depletion route. However, PSOI structures are costly at least with respect to manufacturing time because forming a PSOI requires a complicated process.

FIG. 1 is a diagram of a SOI semiconductor device 100 configured to provide improved heat dissipation and increased breakdown voltage, in accordance with one or more embodiments. The SOI semiconductor device 100 comprises a substrate 101, a buried oxide layer 103 over the substrate 101, a buried n+ region 105 in the substrate 101 below the buried oxide layer 103, and an epitaxial layer 107 over the buried oxide layer 103. The epitaxial layer 107 comprises a p-well 109, an n-well 111, and a drift region 113 between the p-well 109 and the n-well 111. The semiconductor device 100 also comprises a source n+ region 115 in the p-well 109, a source p+ region 117 in the p-well 109, and a drain n+ region 119 in the n-well 111. A source contact 121 is electrically connected to the p-well 109 by a first electrode 123. The first electrode 123 comprises a metal material and/or a polysilicon material. The first electrode 123 is electrically connected to both the source n+ region 115 and the source p+ region 117. Accordingly, the source contact 121 is electrically connected to the p-well 109 by way of the source n+ region 115 and the source p+ region 117.

The semiconductor device 100 further comprises a gate 125 over a portion of the p-well 109 and a portion of the drift region 113. A drain contact 127 is electrically connected to the drain n+ region 119, the n-well 111 and the buried n+ region 105 by a second electrode 129. The second electrode 129 extends from the drain contact 127 through the n-well 111 and through the buried oxide layer 103 to the buried n+ region 105. The second electrode 129 comprises a metal material and/or a polysilicon material. The second electrode 129 is a drain side CTBOX.

The semiconductor device 100 additionally comprises an insulation layer 131 over the epitaxial layer 107. In some embodiments, insulation layer 131 is an oxide layer. In other embodiments, the insulation layer comprises a polymer filler material. The gate 125 is in the insulation layer 131.

In some embodiments, the semiconductor device 100 includes a second electrode insulation layer 133 configured to insulate the second electrode 129 from the epitaxial layer 107. The second electrode insulation layer 133 lines one or more inner walls of an opening within which the second electrode 129 is formed.

In use, heat generated in the semiconductor device 100, for example, at position 135 near the drain side of the semiconductor device 100 is dissipated largely toward the substrate 101 because the second electrode 129 provides a heat sink. For example, a large amount of heat 137 dissipates downward toward the substrate 101.

Also, in use, the semiconductor device 100 increases breakdown voltage by causing crowding of potential 139 to be avoided in the buried oxide layer 103. Potential 139, for example, is caused to be driven away from the drain side of the semiconductor device 100 in the buried oxide layer 103 by the fields produced by buried n+ region 105 until depleted at a depletion edge 141 that occurs some place in the substrate 101.

Figure 2:
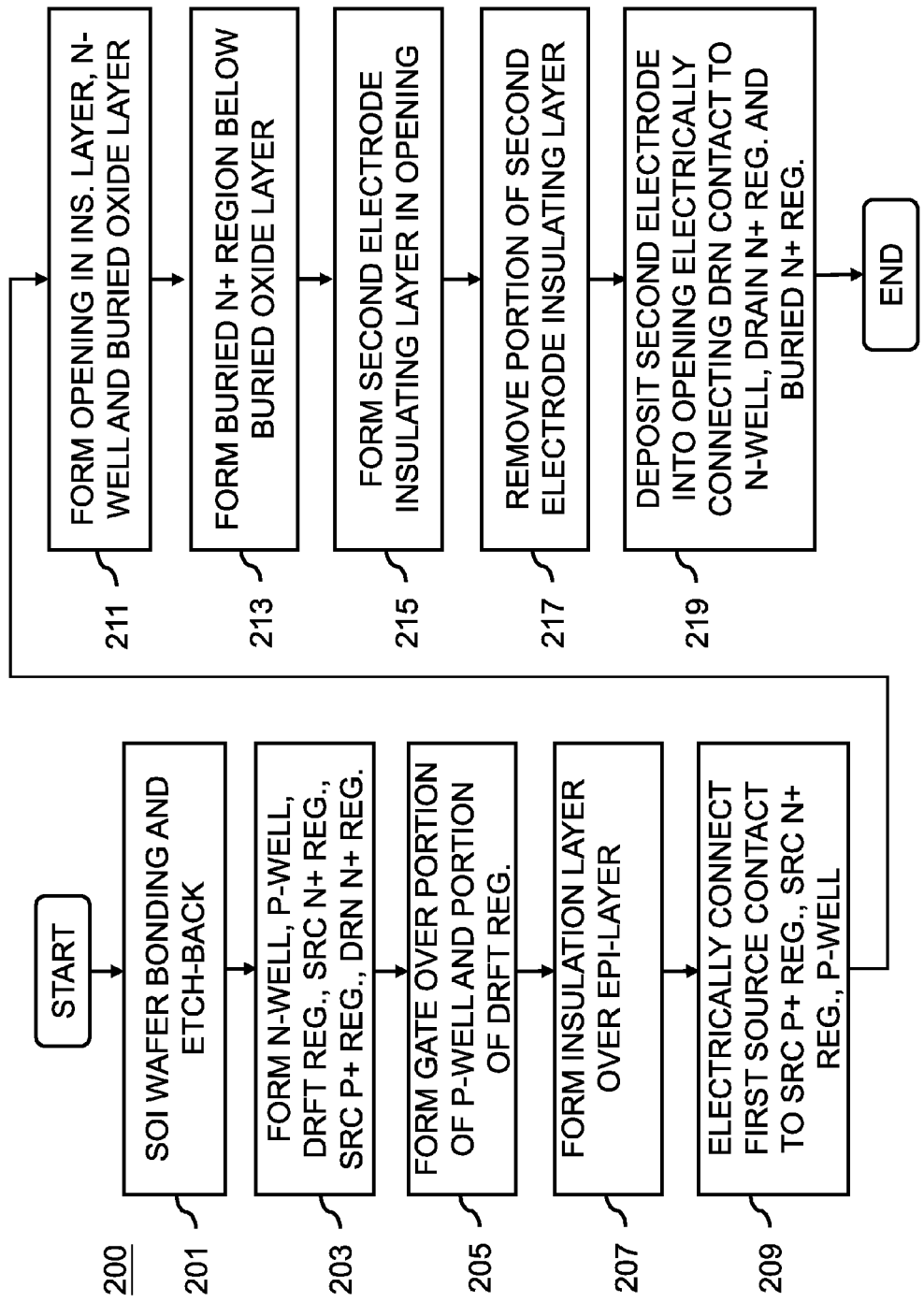
FIG. 2 is a flowchart of a method of forming a semiconductor device, in accordance with one or more embodiments.

FIG. 2 is a flowchart of a method 200 of forming a semiconductor device having a drain side CTBOX, in accordance with one or more embodiments. Method 200 begins with step 201 in which a silicon-on-insulator (SOI) wafer or substrate is prepared by, for example, a wafer bonding and silicon etch-back process. The SOI wafer has a buried oxide layer formed over a substrate of the SOI wafer. In some embodiments, the buried oxide layer is formed by growing an oxide on the substrate through any of a variety of techniques, including low-pressure chemical vapor deposition (LPCVD), atmospheric-pressure chemical vapor deposition (APCVD), plasma-enhanced chemical vapor deposition (PECVD), physical vapor deposition (PVD), and other suitable deposition techniques. Alternatively, the buried oxide layer is formed by a thermal process.

In step 203, a p-well, an n-well, a drift region between the p-well and the n-well, a source n+ region in the p-well, a source p+ region in the p-well, and a drain n+ region in the n-well are formed in an epitaxial layer of the SOI wafer. In some embodiments, the epitaxial layer is formed by any of a variety of techniques, including low-pressure chemical vapor deposition (LPCVD), atmospheric-pressure chemical vapor deposition (APCVD), plasma-enhanced chemical vapor deposition (PECVD), physical vapor deposition (PVD), and other suitable deposition techniques. Alternatively, the epitaxial layer is formed by a thermal process. In one or more embodiments, the p-well, n-well, source p+ region, drain p+ region, and drain n+ region of the epitaxial layer are formed n some embodiments, the first semiconductor region is formed by doping or implanting, for example by ion implant, P-type dopants, such as boron, BF2, or other suitable dopant, or N-type dopants, such as phosphorus, arsenic, or other suitable dopant; or a combination thereof.

In step 205, a gate is formed over a portion of the p-well and a portion of the drift region in the insulation layer.

In step 207, an insulation layer is formed over the epitaxial layer. In some embodiments, the insulation layer is formed by any of a variety of techniques, including low-pressure chemical vapor deposition (LPCVD), atmospheric-pressure chemical vapor deposition (APCVD), plasma-enhanced chemical vapor deposition (PECVD), physical vapor deposition (PVD), and other suitable deposition techniques. Alternatively, the insulation layer is formed by a thermal process.

In step 209, a source contact is electrically connected to the source n+ region and the source p+ region, and the p-well by way of the source n+ region and to the source p+ region.

In step 211, an opening is formed through the insulation layer, the n-well, and the buried oxide layer. The opening is formed by, for example, an etching process such as a wet or a dry etch, a microlithography process, nanolithography process, or any other suitable process for forming an opening in one or more layers of a semiconductor device.

In step 213, a buried n+ region is formed in the substrate below the buried oxide layer. In some embodiments, the buried n+ region is formed by doping or implanting by, for example, an ion implant, N-type dopants, such as phosphorus, arsenic, other suitable dopant, or a combination thereof.

In step 215, a second electrode insulating layer is formed on one or more inner walls of the opening within which a second electrode is deposited to insulate the second electrode from the epitaxial layer. In some embodiments, the second electrode insulating layer is formed by any of a variety of techniques, including low-pressure chemical vapor deposition (LPCVD), atmospheric-pressure chemical vapor deposition (APCVD), plasma-enhanced chemical vapor deposition (PECVD), physical vapor deposition (PVD), and other suitable deposition techniques. Alternatively, the second electrode insulating layer is formed by a thermal process.

In step 217, at least a portion of the second electrode insulating layer is removed to expose the buried n+ region to facilitate electrically connecting the drain contact to the buried n+ region using the second electrode. The portion of the second electrode insulating layer is removed by, for example, an etching process such as a wet or a dry etch, a microlithography process, nanolithography process, or any other suitable process for forming an opening in one or more layers of a semiconductor device.

In step 219, the second electrode is deposited into the opening, electrically connecting a drain contact to the n-well, to the drain n+ region, and to the buried n+ region.

Figure 3:
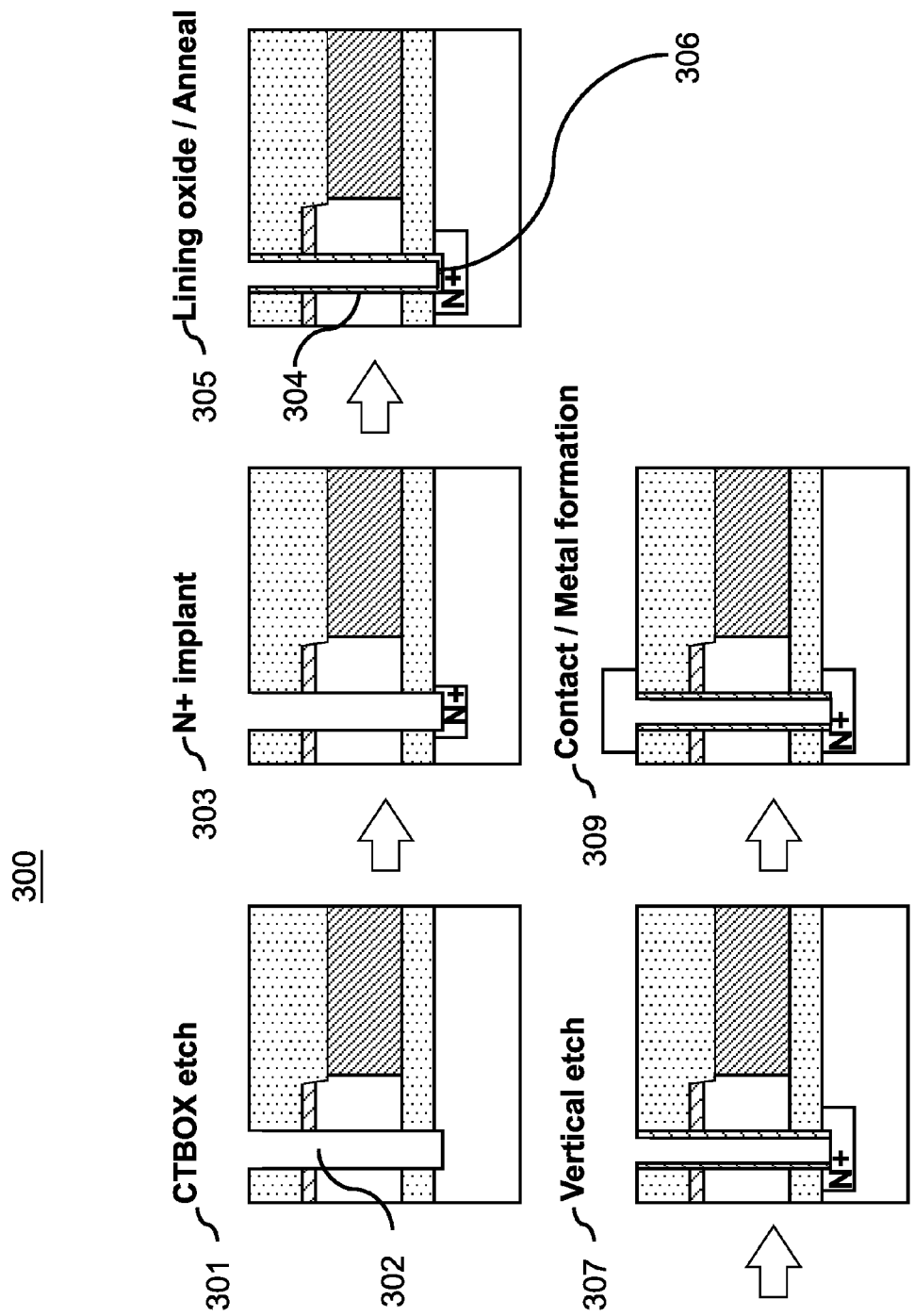
FIG. 3 is a flowchart of a process, in accordance with one or more embodiments.

FIG. 3 is a flowchart of a process 300 showing the formation of a drain side CTBOX, in accordance with one or more embodiments. FIG. 3 illustrates many of the features of the semiconductor device 100 discussed above with regard to FIG. 1, but the reference numerals are omitted for clarity.

The process begins with step 301 in which an opening 302 is formed through the insulation layer 131, the n-well 111, and the buried oxide layer 103 to at least expose an upper surface of the substrate 101. The opening 302 optionally extends into a portion of the substrate 101. The opening 302, for example, is formed by an etching process or other suitable process for forming an opening in one or more layers of a semiconductor device.

In step 303, the buried n+ region 105 is formed in the substrate 101 at the base of the opening 302. In some embodiments, the buried n+ region 105 is formed by doping or implanting by, for example, an ion implant, N-type dopants, such as phosphorus, arsenic, other suitable dopant, or a combination thereof.

In step 305, the second electrode insulating layer 133 is formed on one or more inner walls 304 of the opening 302 within which the second electrode 129 is deposited to insulate the second electrode 129 from the epitaxial layer 107. In step 307, at least a portion 306 of the second electrode insulating layer 131 is removed to expose the buried n+ region 105 to facilitate electrically connecting the drain contact 127 to the buried n+ region 105 using the second electrode 129. For example, the portion of the buried n+ region 105 is removed by an etching process or other suitable process for removing a portion of a layer to form an opening in one or more layers of a semiconductor device. In step 309, the second electrode 129 material is deposited into the opening 301, electrically connecting the drain contact 127 to the n-well 111, to the drain n+ region 119, and to the buried n+ region 105.

One aspect of this description relates to a semiconductor device comprising a substrate, a buried oxide layer over the substrate, a buried n+ region in the substrate below the buried oxide layer, and an epitaxial layer over the buried oxide layer. The epitaxial layer comprises a p-well, an n-well, and a drift region between the p-well and the n-well. The semiconductor device also comprises a source contact, a first electrode electrically connecting the source contact to the p-well, and a gate over a portion of the p-well and a portion of the drift region. The semiconductor device further comprises a drain contact, and a second electrode extending from the drain contact through the n-well and through the buried oxide layer to the buried n+ region. The second electrode electrically connects the drain contact to the n-well and to the buried n+ region.

Another aspect of this description relates to a method comprising forming a silicon-on-insulator wafer having a buried oxide layer over a substrate, forming a buried n+ region in the substrate below the buried oxide layer, and forming a p-well, an n-well, and a drift region between the p-well and the n-well in an epitaxial layer of the silicon-on-insulator wafer over the buried oxide layer. The method also comprises electrically connecting a source contact to the p-well using a first electrode, forming a gate over a portion of the p-well and a portion of the drift region, and forming an opening through the n-well and the epitaxial layer to expose the buried n+ region. The method further comprises depositing a second electrode in the opening, and electrically connecting a drain contact to the n-well and to the buried n+ region using the second electrode.

A further aspect of this description relates to a method comprising forming an opening through an n-well and a buried oxide layer of a silicon-on-insulator wafer to expose a buried n+ region of the silicon-on-insulator wafer, the buried n+ region being in a substrate of the silicon-on-insulator below the buried oxide layer. The method further comprises electrically connecting a source contact to a p-well of the silicon-on-insulator wafer using a first electrode. The method also comprises depositing a second electrode in the opening. The method additionally comprises electrically connecting a drain contact to an n-well of the silicon-on-insulator wafer and to the buried n+ region using the second electrode.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A semiconductor device comprising:
    a substrate;
    a buried oxide layer over the substrate;
    a buried n+ region in the substrate below the buried oxide layer;
    an epitaxial layer over the buried oxide layer, the epitaxial layer comprising;
        a p-well;
        an n-well; and
        a drift region between the p-well and the n-well;
    a source contact;
    a first electrode electrically connecting the source contact to the p-well;
    a gate over a portion of the p-well and a portion of the drift region;
    a drain contact; and
    a second electrode extending from the drain contact through the n-well and through the buried oxide layer to the buried n+ region,
    wherein the second electrode electrically connects the drain contact to the buried n+ region.

2. The semiconductor device of claim 1, further comprising:
    a source n+ region in the p-well; and
    a source p+ region in the p-well,
    wherein the first electrode is electrically connected to the source n+ region and to the source p+ region, and the first electrode is electrically connected to the p-well by way of the source n+ region and to the source p+ region.

3. The semiconductor device of claim 1, further comprising:
    a drain n+ region in the n-well,
    wherein the second electrode is further electrically connected to the drain contact and to the drain n+ region in the n-well.

4. The semiconductor device of claim 1, further comprising:
    an insulation layer over the epitaxial layer.

5. The semiconductor device of claim 4, wherein the insulation layer is an oxide layer.

6. The semiconductor device of claim 4, wherein the gate is in the insulation layer.

7. The semiconductor device of claim 1, wherein the second electrode comprises a metal material.

8. The semiconductor device of claim 1, wherein the second electrode comprises a polysilicon material.

9. The semiconductor device of claim 1, wherein the second electrode is insulated from the epitaxial layer.

10. The semiconductor device of claim 9, wherein the second electrode is insulated from the epitaxial layer by an insulation layer lining one or more inner walls of an opening within which the second electrode is formed.

11. A method comprising:
    forming a silicon-on-insulator wafer having a buried oxide layer over a substrate;
    forming a buried n+ region in the substrate below the buried oxide layer;
    forming a p-well, an n-well, and a drift region between the p-well and the n-well in an epitaxial layer of the silicon-on-insulator wafer over the buried oxide layer;
    electrically connecting a source contact to the p-well using a first electrode;
    forming a gate over a portion of the p-well and a portion of the drift region;
    forming an opening through the n-well and the buried oxide layer to expose the buried n+ region;
    depositing a second electrode in the opening; and
    electrically connecting a drain contact to the buried n+ region using the second electrode.

12. The method of claim 11, further comprising:
    forming a source n+ region in the p-well;
    forming a source p+ region in the p-well; and electrically connecting the source n+ region and the source p+ region to the source contact using the first electrode,
wherein the source contact is electrically connected to the p-well by way of the source n+ region and to the source p+ region.

13. The method of claim 11, further comprising:
forming a drain n+ region in the n-well; and
electrically connecting the drain contact to the n+ region in the n-well.

14. The method of claim 11, further comprising:
forming an insulation layer over the epitaxial layer.

15. The method of claim 14, wherein the insulation layer is an oxide layer.

16. The method of claim 14, wherein the gate is in the insulation layer.

17. The method of claim 11, further comprising:
forming a second electrode insulating layer on one or more inner walls of the opening within which the second electrode is deposited to insulate the second electrode from the epitaxial layer.

18. The method of claim 17, further comprising:
removing at least a portion of the second electrode insulating layer to expose the buried n+ region to facilitate electrically connecting the drain contact to the buried n+ region using the second electrode.

19. A method comprising:
forming an opening through an n-well and a buried oxide layer of a silicon-on-insulator wafer to expose a buried n+ region of the silicon-on-insulator wafer, the buried n+ region being in a substrate of the silicon-on-insulator below the buried oxide layer;
electrically connecting a source contact to a p-well of the silicon-on-insulator wafer using a first electrode;
depositing a second electrode in the opening; and
electrically connecting a drain contact to the buried n+ region using the second electrode.

20. The method of claim 19, further comprising:
forming a second electrode insulating layer on one or more inner walls of the opening within which the second electrode is deposited to insulate the second electrode from an epitaxial layer of the silicon-on-insulator wafer; and
removing at least a portion of the second electrode insulating layer to expose the buried n+ region to facilitate electrically connecting the drain contact to the buried n+ region using the second electrode.

* * * * *